United States Patent (10) Patent No.: US 8,988,566 B2
Wang et al. (45) Date of Patent: Mar. 24, 2015

(54) LENS ARRAY FOR PARTITIONED IMAGE SENSOR HAVING COLOR FILTERS

(75) Inventors: Chia-Ching Wang, Hsinchu (TW); Jau-Jan Deng, Taipei (TW); Yun-Chiang Hsu, Yangmei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 328 days.

(21) Appl. No.: 13/570,449

(22) Filed: Aug. 9, 2012

(65) Prior Publication Data

US 2014/0043507 A1 Feb. 13, 2014

(51) Int. Cl.
*H04N 5/225* (2006.01)
*H04N 5/335* (2011.01)
*H04N 9/04* (2006.01)
*H01L 27/146* (2006.01)

(52) U.S. Cl.
CPC ............. *H04N 5/2254* (2013.01); *H04N 9/045* (2013.01); *H01L 27/14621* (2013.01); *H01L 27/14627* (2013.01); *H01L 27/14685* (2013.01)
USPC ............................. 348/272; 348/273; 348/267

(58) Field of Classification Search
CPC .... H04N 5/3537; H04N 9/045; H04N 5/2254
USPC .......................................... 348/272, 273, 267
See application file for complete search history.

(56) References Cited

U.S. PATENT DOCUMENTS 7,247,851 B2 7/2007 Okada et al.
7,453,510 B2 * 11/2008 Kolehmainen et al. ....... 348/340
7,812,869 B2 10/2010 Boettiger
2002/0089596 A1 7/2002 Suda
2006/0023314 A1 2/2006 Boettiger et al.
2006/0226452 A1 10/2006 Yamaguchi
2007/0008421 A1 1/2007 Wu et al.
2007/0126898 A1 * 6/2007 Feldman et al. ............... 348/294
2008/0049126 A1 2/2008 Ford et al.
2008/0128843 A1 6/2008 Lee
2008/0142685 A1 6/2008 Gazeley (Continued)

FOREIGN PATENT DOCUMENTS

EP 1067802 A2 1/2001
EP 2214405 A2 8/2010

OTHER PUBLICATIONS

EP 13167195.0—European Search Report and Search Opinion, dated Nov. 6, 2013 (11 pages).

(Continued)

*Primary Examiner* — Twyler Haskins
*Assistant Examiner* — Quang Le
(74) *Attorney, Agent, or Firm* — Blakely Sokoloff, Taylor & Zafman LLP (57) ABSTRACT

An apparatus includes an image sensor including N image sensor regions arranged thereon. N lens structures are included in a lens array disposed proximate to the image sensor. Each one of the N lens structures is arranged to focus a single image onto a respective one of the N image sensor regions. The N lens structures include a first lens structure having a red color filter, a second lens structure having a green color filter, and a third lens structure having a blue color filter. Each one of the N lens structures includes a glass wafer and a lens formed on the glass wafer. Each one of the red color filter, the green color filter, and the blue color filter is one of coated on the glass wafer underneath the lens and coated over the lens on the glass wafer.

17 Claims, 9 Drawing Sheets

(56) References Cited

U.S. PATENT DOCUMENTS

| | | |
|---|---|---|
| 2010/0065897 A1 | 3/2010 | Jun |
| 2011/0122308 A1* | 5/2011 | Duparre .................. 348/340 |
| 2011/0194019 A1 | 8/2011 | Shyu et al. |
| 2012/0104525 A1 | 5/2012 | Wu et al. |
| 2013/0320195 A1 | 12/2013 | Wang et al. |

OTHER PUBLICATIONS

EP 13179183.2—Extended European Search Report, dated Jul. 16, 2014 (7 pages).

TW Patent Application No. 102115760—First Taiwanese Office Action, issued Sep. 24, 2014, with Search Report and English Translation (14 pages).

\* cited by examiner

LENS ARRAY FOR PARTITIONED IMAGE SENSOR HAVING COLOR FILTERS

REFERENCE TO RELATED APPLICATION(S)

This application is related to co-pending patent application Ser. No. 13/486,787, filed Jun. 1, 2012, entitled "LENS ARRAY FOR PARTITIONED IMAGE SENSOR," and assigned to the Assignee of the present application.

BACKGROUND INFORMATION

1. Field of the Disclosure

The present invention relates generally to image sensors, and more specifically, to a lens array for a partitioned image sensor having color filters.

2. Background

An image capture unit typically includes an image sensor and an imaging lens. The imaging lens focuses light onto the image sensor to form an image, and the image sensor converts the light into electric signals. The electric signals are output from the image capture unit to other units in a host electronic system or a subsystem. The electronic system may be a mobile phone, a computer, a digital camera or a medical device.

As the use of image capture units in electronic systems increases, so do the demands for image capture unit features, capabilities and device dimensions. For example, image capture units are increasingly required to have lower profiles so that overall sizes of electronic systems including the image capture units can be reduced while at the same time not sacrifice quality in the optical images that are captured. The profile of an image capture unit may be associated with the distance from the bottom of image sensor to the top of the imaging lens.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Example methods and apparatuses directed to a low profile image capture unit are disclosed. As will be appreciated, a low profile image capture unit according to the teachings of the present invention may include an array of lenses having individual filters disposed on a partitioned image sensor. Furthermore, the quality of optical images captured, which may for example be express in terms of resolution (i.e., the number of pixels) and/or sharpness, is not sacrificed for the low profile in accordance with the teachings of the present invention.

Figure 1A:
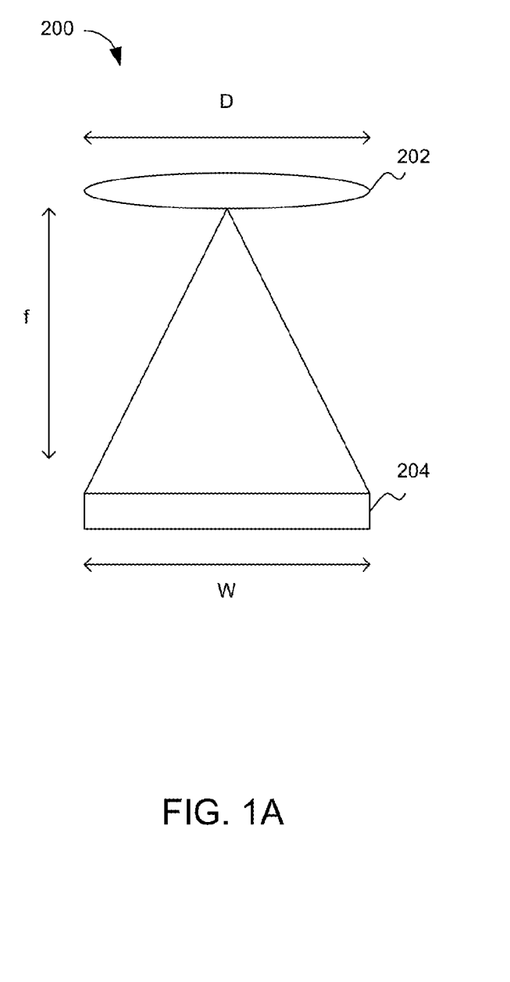
FIG. 1A is a schematic diagram of an image capture unit including an imaging lens and an image sensor.
Figure 1B:
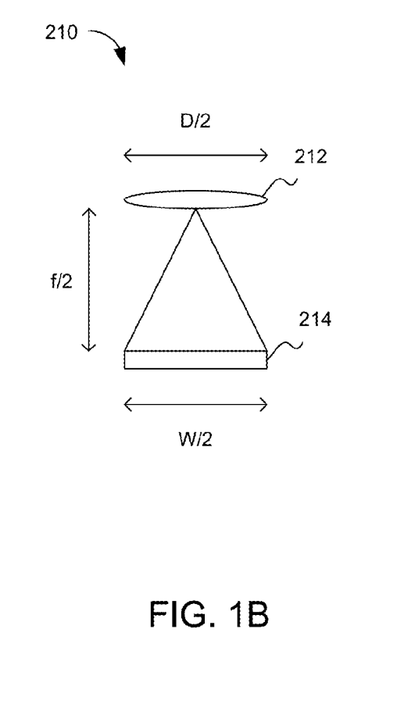
FIG. 1B is a schematic diagram of a low profile image capture unit including a low profile imaging lens and an image sensor.

To illustrate, FIG. 1A is a schematic diagram of an image capture unit 200 including an imaging lens 202 and an image sensor 204. The distance between lens 202 and image sensor 204 is approximately f, where f is the focal length of lens 202. The width of the image sensor 204 covered by lens 202 is W, and the lens diameter is D. For comparison, FIG. 1B shows a schematic diagram of a low profile image capture unit 210 including an imaging lens 212 and an image sensor 214. The distance between lens 212 and image sensor 214 is approximately f/2, where f/2 is the focal length of lens 212. The width of the image sensor 214 covered by lens 212 is W/2, and the lens diameter is D/2.

In a low profile image capture unit, the imaging lens is replaced with a low profile imaging lens, while the image sensor is unchanged. Image sensors 204 and 214 are the same image sensor, and both image sensors have the same pixel array structure. Since the width of image sensor 214 is half of the width of image sensor 204, image sensor 214 will have half of number of pixels as compared with image sensor 204 in one dimension. In two dimensions, image sensor 214 will have quarter of number of pixels as compared with image sensor 204. In other words, the number of pixels of the image captured is approximately proportional to the square of the scale of the distance between the lens and the image sensor.

Figure 2:
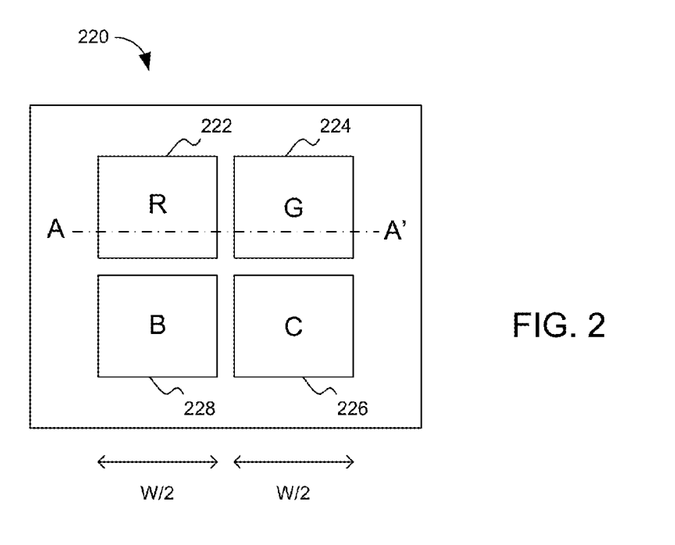
FIG. 2 illustrates one example of an image sensor having four partitioned areas in accordance with the teachings of the present invention.

FIG. 2 illustrates an image sensor 220 having four partitioned areas 222, 224, 226, and 228 closely arranged proximate to each other in accordance with the teachings of the present invention. Each partitioned area 222, 224, 226, and 228 is covered by a respective imaging lens (e.g., lens 212 of FIG. 1B). In this manner, the focal length of the imaging lens (e.g., lens 212 of FIG. 1B) can be half of the imaging lens when the image sensor is not partitioned into four areas (e.g., lens 202 of FIG. 1A). Thus, a low profile image capture unit can be constructed using four lenses and four partitioned areas of an image sensor. The low profile image capture unit will have approximately the same resolution (i.e., the same number of pixels) as compared with the original image capture unit, because four areas of image sensor are used. An area of image sensor may be similar to image sensor 214 of FIG. 1B.

Figure 3A:
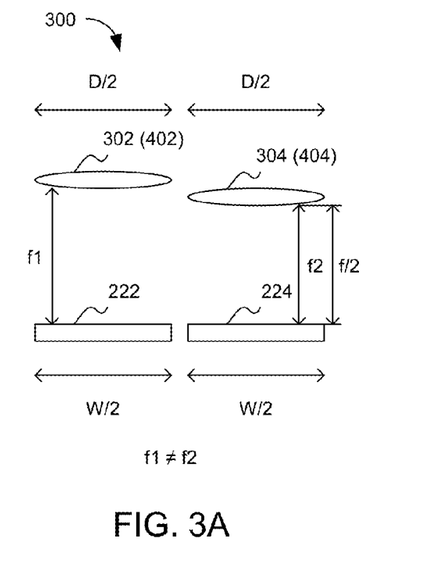
FIG. 3A is a cross-section illustrating two lenses having different focal lengths and two partitioned areas of one example of a low profile image capture unit in accordance with the teachings of the present invention.

For illustration, FIG. 3A shows a cross-section of low profile image capture unit 300 including four imaging lenses and four partitioned areas of image sensor in accordance with the teachings of the present invention. In one example, the cross-section illustrated in FIG. 3A may correspond with dashed line A-A' of FIG. 2. The four partitioned areas of image sensor may be areas 222, 224, 226, and 228 of image sensor 220 of FIG. 2. Only two imaging lenses 302 and 304 having focal lengths f1 and f2, respectively, are shown in FIG. 3A. Similarly only two partitioned areas 222 and 224 of image sensor 220 are shown in FIG. 3A. In this manner, an image capture system having low profile can be constructed, while the resolution (i.e., the number of pixels) of images captured can be maintained.

As shown in the illustrated example, imaging lens 302 is positioned a first focal length f1 away from respective image sensor 222. Imaging lens 304 is positioned a second focal length f2 away from respective image sensor 224. As shown in the depicted example, the second focal length f2 is approximately half of the focal length when compared with lens 202 shown in FIG. 1A. Thus, example image capture unit 300 of FIG. 3A is a low profile image capture unit such that the width of the image sensors 222 and 224 covered by lens 302 and 304 are W/2, and the lens diameters of lenses 302 and 304 are D/2 in accordance with the teachings of the present invention.

Figure 4:
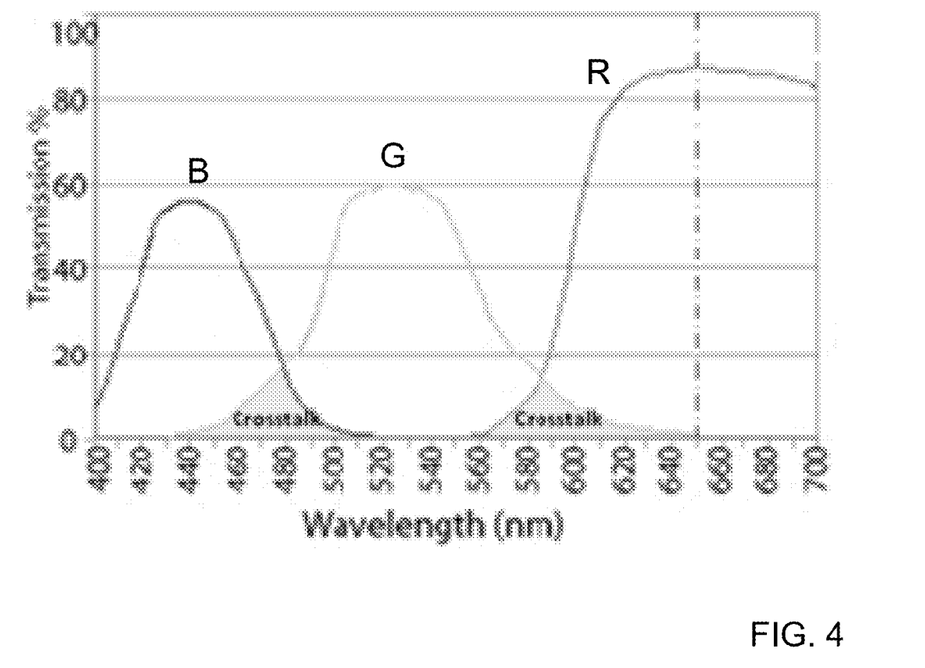
FIG. 4 illustrates example transmission spectra of photoresist materials for red, green, and blue filters.

A typical image capture unit may include a Bayer type color filter array on the image sensor. Bayer type color filter array is typically made from photo-resist materials. The transmission spectra of photo-resist materials for red (R), green (G), and blue (B) filters are depicted in FIG. 4. The transmission of red filter includes an IR spectrum, e.g., wavelength beyond 650 nm. Thus, an IR-cut filter is generally required to cut the transmission of wavelength beyond 650 nm. There are also crosstalk domains in FIG. 4 that may degrade the quality of the color image.

In contrast, partitioned areas of image sensor 222 and 224 of FIG. 3A may not include Bayer type color filter array. Referring back to FIG. 2, partitioned areas 222, 224, 226, and 228 may be designated to red (R), green (G), clear (C), and blue (B) areas, respectively. Red area may be covered by a single red filter, green area may be covered by a single green filter, blue area may be covered by a single blue filter, and clear or C area may not be covered by any filter or may be covered by a single green filter.

The making of Bayer type color filter array on the image sensor is based on a semiconductor lithographic process requiring very accurate overlay as sensor pitch decreases. Thus the Bayer type color filter coating is a very expensive process. Moreover, rework process will increase risk of damaging the image sensor. On the other hand, the single color filter coating on a glass substrate, e.g., a glass wafer of a wafer-level lens cube, is an inexpensive process without necessity of accurate mask and alignment. Rework on glass substrate is very easy.

As shown in the example of FIG. 3A, the first focal length f1 may be different than the second focal length f2. In one example, the first focal length f1 corresponds with light having a first color, such as for example but not limited to red (R), and second focal length f2 corresponds with light having a second color, such as for example but not limited to green (G). Accordingly, a single image having the first color is focused by lens 302 onto image sensor 222 and the same single image having the second color is focused by lens 304 onto image sensor 224 in accordance with the teachings of the present invention.

Referring briefly back to the example depicted in FIG. 2, the red (R) area includes red pixels only, the green (G) area includes green pixels only, and the blue (B) area includes blue pixels only. The clear or C area may include white pixels when no filter is applied, and green pixels when a green filter is applied. A readout system and/or processor (not shown) may rearrange red, green, and blue pixels into Bayer pattern or any pattern for further processing the color signals and forming the color images. C pixels may be use as white pixels for particular processing or simply contribute as green pixels in accordance with the teachings of the present invention.

Figure 5:
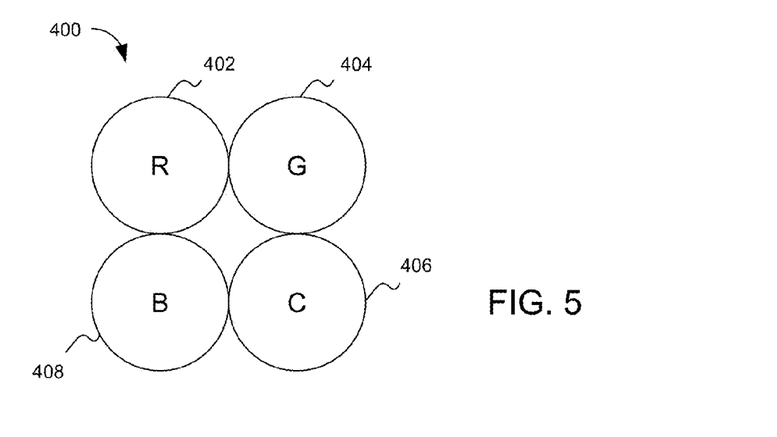
FIG. 5 illustrates one example of a 2×2 lens array for a partitioned image sensor in accordance with the teachings of the present invention.

FIG. 5 illustrates a lens array 400 for the partitioned image sensor in accordance with the teachings of the present invention. The partitioned image sensor may be image sensor 220 of FIG. 2. Lens array 400 may be a 2×2 array having low profile lenses 402, 404, 406, and 408, which are designated to red (R), green (G), clear (C), and blue (B) areas, respectively. In other words, each one of the lenses 402, 404, 406, and 408 is arranged to focus a single image onto a respective one of the red (R), green (G), clear (C), and blue (B) areas image sensor regions. Thus, lens 402 forms a red image only, lens 404 forms a green image only, and lens 408 forms a blue image only.

In one example, each one of the lenses 402, 404, 406, and 408 has a different respective focal length that corresponds with the specific color of light that is being focused onto the corresponding image sensor region (e.g., see FIG. 3A). In another example, each one of the lenses 402, 404, 406, and 408 has a different respective radius of curvature (ROC) that corresponds with the specific color of light that is being focused onto the corresponding image sensor region (e.g., see FIG. 3B). In yet another example, lenses 402, 404, 406, and 408 may have the same focal length and the same ROC.

Since each lens 402, 404, 406, and 408 forms individually a single color image, the optical quality, e.g., sharpness, of each individual image may be improved by adjusting individually the focal length distance between each lens and the corresponding image sensor. Thus, in one example, the focal length distance between each one of the lenses 402, 404, 406, and 408 and the corresponding partitioned image sensor may be adjusted individually according to the wavelength of light, in order to get a high quality image, in accordance with the teachings of the present invention (e.g., see FIG. 3A). The focal length of C lens 406 may be the same with one of lenses 402, 404, and 408.

Figure 3B:
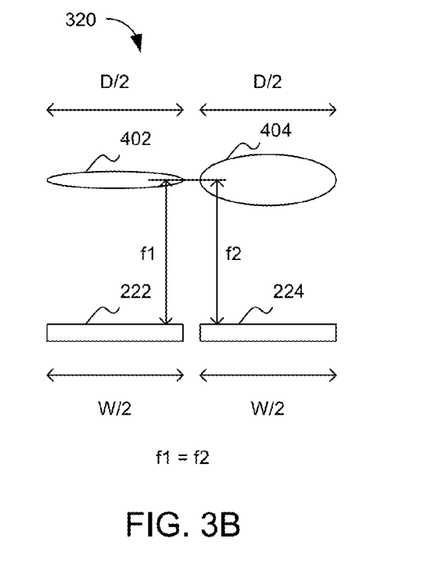
FIG. 3B is a cross-section illustrating two lenses having different radii of curvature and two partitioned areas of one example of a low profile image capture unit in accordance with the teachings of the present invention.

In another example depicted in FIG. 3B, since each lens 402, 404, 406, and 408 forms individually a single color image, the optical quality, e.g., sharpness, of each individual image may be improved by forming each lens 402, 404, 406, and 408 with different ROC. Similar to FIG. 3A, FIG. 3B shows a cross-section of low profile image capture unit 320 including four imaging lenses and four partitioned areas of image sensor in accordance with the teachings of the present invention. The cross-section illustrated in FIG. 3B may correspond with dashed line A-A' of FIG. 2. The ROC of lenses 402 and 404 are different such that the focal lengths of lenses 402 and 404 become the same. By doing so, the focal lengths of each lens 402, 404, 406, and 408 at individual color may be the same, and thus no individual adjustment of the focal length distance between each lens and the corresponding image sensor is necessary, in accordance with the teachings of the present invention. While the radii of curvature of R, G, and B lenses are different, the ROC of C lens 406 may be the same with one of lenses 402, 404, and 408.

As will be discussed below in yet another example, lenses 402, 404, 406, and 408 may have the same ROC, and the focal length difference of lenses 402, 404, 406, and 408 may be small and negligible, in accordance with the teachings of the present invention (e.g., see FIGS. 7A and 7B).

Figure 6:
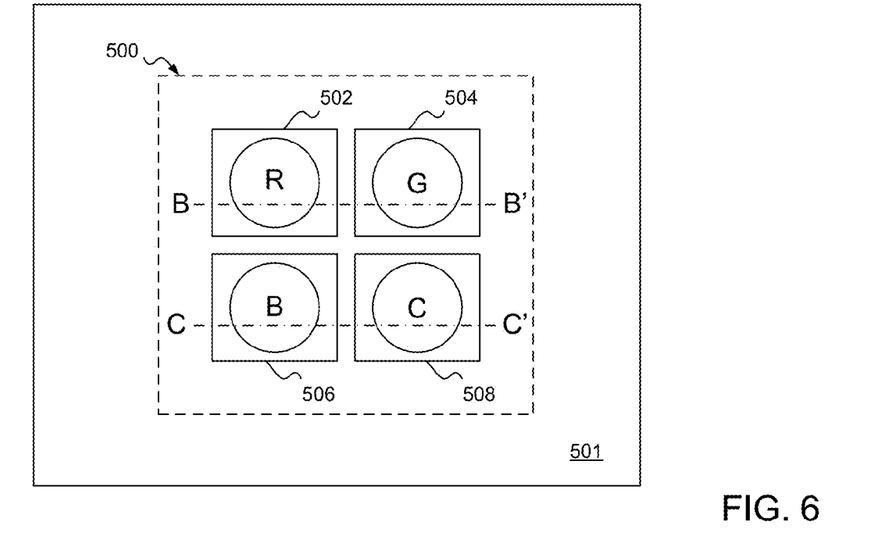
FIG. 6 illustrates one example of a 2×2 lens array on a partitioned image sensor in accordance with the teachings of the present invention.

FIG. 6 illustrates a 2×2 lens array 500 disposed proximate to a partitioned image sensor 501 in accordance with the teachings of the present invention. In one example, lens array 500 may include individual wafer-level lens cubes 502, 504, 506, and 508, which are identical lenses, to focus a single image onto a respective one of the respective partitions of image sensor 501 in accordance with the teachings of the present invention. In the depicted example, lenses 502, 504, 506, and 508 are designated to R, G, B, and C areas, respectively. As described previously, the focal length positions of R lens 502, G lens 504, B lens 506, and C lens 508 may be properly adjusted. However, for the sake of simplicity, only an example without focal length adjustment will be discussed herewith in an example in accordance with the teachings of the present invention. It is appreciated that the embodiment can be extended to include an example with focal length adjustment (e.g., see FIG. 3A) as well as an example with lenses having different ROCs (e.g., see FIG. 3B) in accordance with the teachings of the present invention.

Figure 7A:
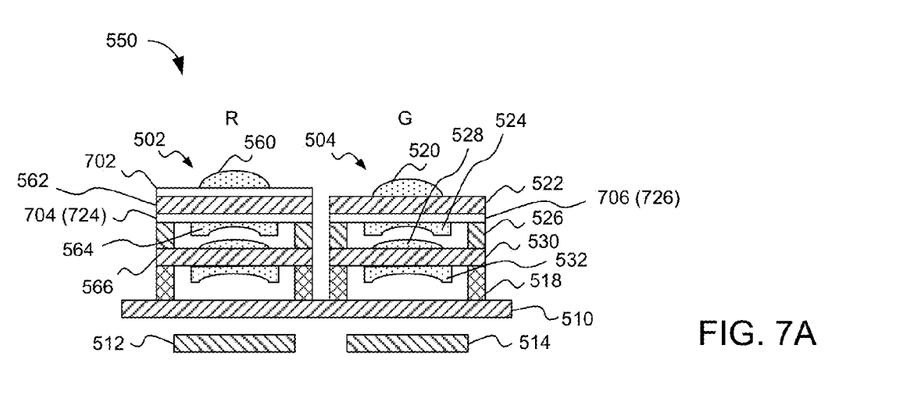
FIG. 7A illustrates a cross section of one example of a 2×2 lens array on a partitioned image sensor in accordance with the teachings of the present invention.

FIG. 7A illustrates an example including the cross-section 550 of 2×2 lens array 500 in accordance with the teachings of the present invention. Only lens cubes 502 and 504 are shown in FIG. 7A. The cross-section illustrated in FIG. 7A may correspond with dashed line B-B' of FIG. 6. As shown in the depicted example, lens cubes 502 and 504 are disposed on a cover glass 510. Partitioned areas 512 and 514 of a single image sensor are under cover glass 510, aligned with lens cubes 502 and 504, respectively.

In one example, each wafer-level lens cube includes at least a glass wafer and a lens on the glass wafer. Typically, each wafer-level lens cube may include a lens 520 on a glass wafer 522, a lens 524 on the other side of glass wafer 522, a lens 528 on a glass wafer 530, a lens 532 on the other side of glass wafer 530, glass wafers 522 and 530, a spacer 526 between glass wafers 522 and 530, and a spacer 518 between glass wafer 530 and cover glass 510.

Figure 8A:
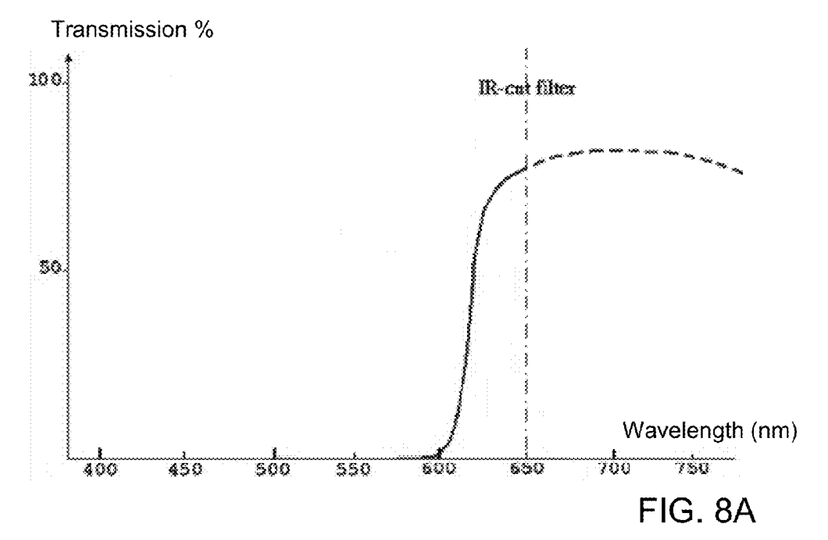
FIG. 8A illustrates an example combined transmission spectrum of an IR-cut filter and red color filter in accordance with the teachings of the present invention.
Figure 8B:
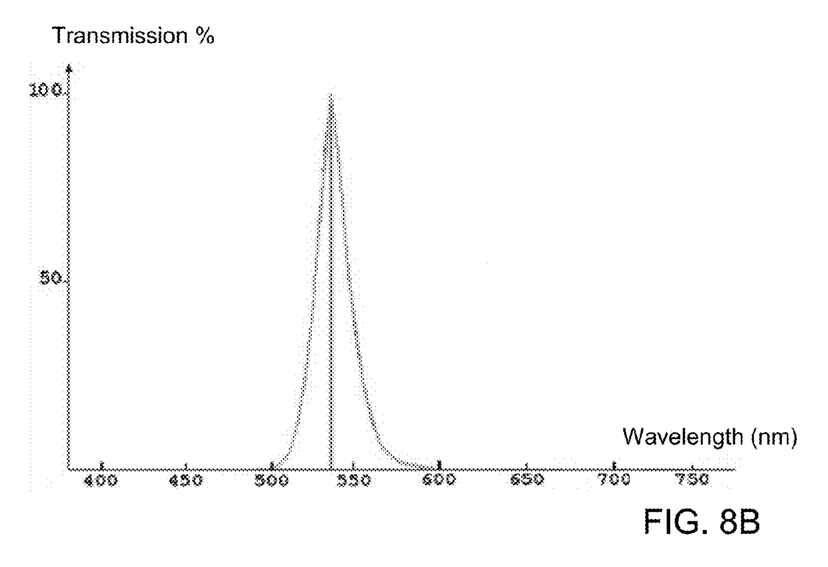
FIG. 8B illustrates an example transmission spectrum of a green color filter in accordance with the teachings of the present invention.

As shown in the depicted example, an IR-cut filter 702 is disposed on a glass wafer 562 underneath a lens 560. IR-cut filter 702 may be multilayer dielectric coatings. For example, the multilayer dielectric coatings may include alternate layers of high and low refractive indexes. A red color filter 704 is disposed in contact with the other side of glass wafer 562 between glass wafer 562 and a lens 564. Red color filter 704 may be a photo-resist coating. The combined transmission spectrum of IR-cut filter 702 and red color filter 704 is depicted in FIG. 8A. In one example, the transmission of wavelengths beyond 650 nm will be cut by IR-cut filter 702. A green color filter 706 is disposed in contact with glass wafer 522 between glass wafer 522 and lens 524. Green color filter 706 may be a photo-resist coating. The transmission spectrum of green color filter 706 is depicted in FIG. 8B.

IR-cut filter 702 and red filter 704 may be formed on either side of glass wafer 562. Furthermore, IR-cut filter 702 and red filter 704 may be formed on either side of a second glass wafer 566. Similarly, green filter 706 may be formed on either side of glass wafer 522, or either side of second glass wafer 530, in accordance with the teachings of the present invention.

Figure 7B:
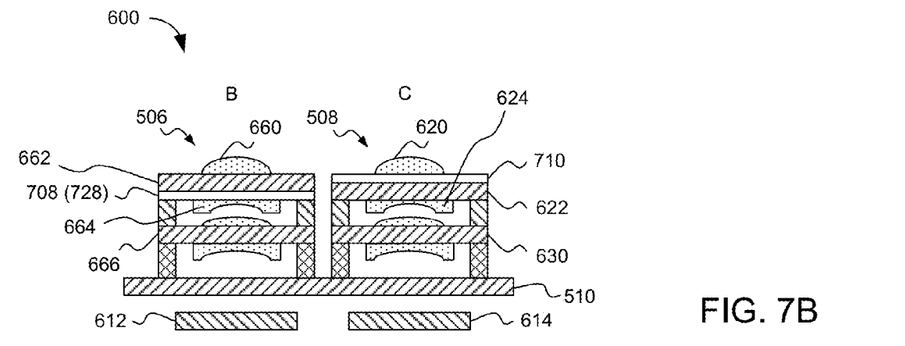
FIG. 7B illustrates another cross section of one example of a 2×2 lens array on a partitioned image sensor in accordance with the teachings of the present invention.

FIG. 7B illustrates the cross-section 600 of 2×2 lens array 500 in accordance with the teachings of the present invention. Only lens cubes 506 and 508 are shown in FIG. 7B. The cross-section illustrated in FIG. 7B may correspond with dashed line C-C' of FIG. 6. As shown in the depicted example, lens cubes 506 and 508 are disposed on a cover glass 510. Partitioned areas 612 and 614 of a single image sensor are under cover glass 510, aligned with lens cubes 506 and 508, respectively.

Figure 8C:
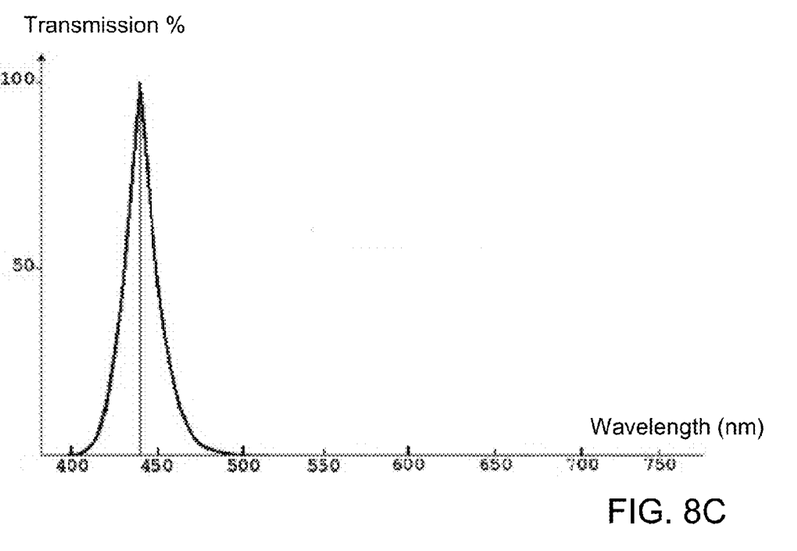
FIG. 8C illustrates an example transmission spectrum of blue color filter in accordance with the teachings of the present invention.
Figure 8D:
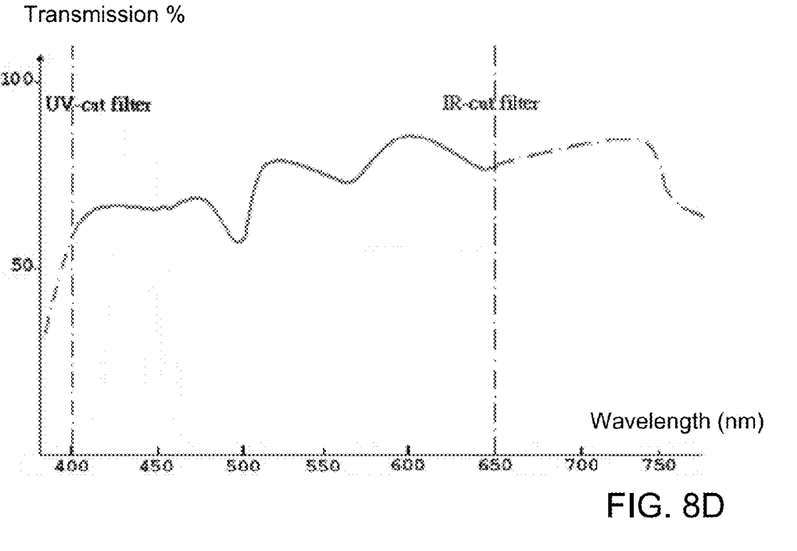
FIG. 8D illustrates an example daylight spectrum transmitted through a UV-IR-cut filter in accordance with the teachings of the present invention.
Figure 8E:
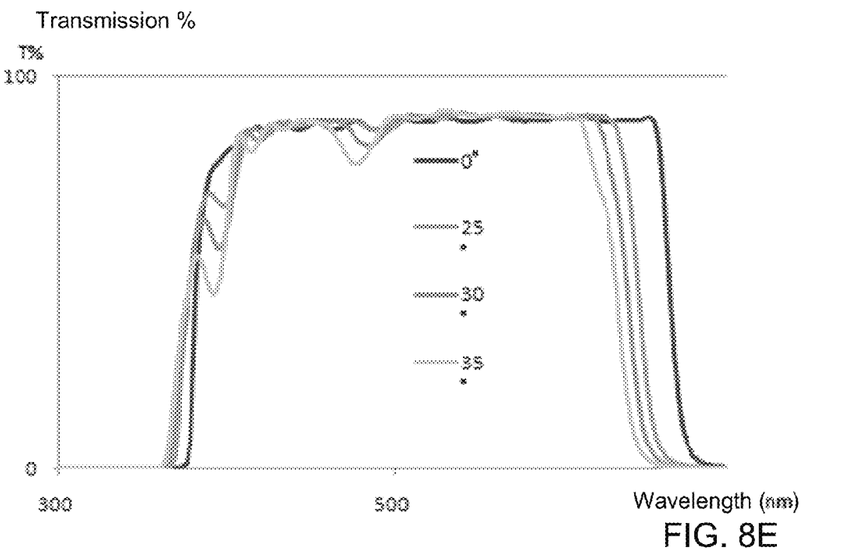
FIG. 8E illustrates an example transmission spectra of UV-IR-cut filter for 0°, 25°, 30°, and 35° incident light in accordance with the teachings of the present invention.

A blue color filter 708 is disposed in contact with a glass wafer 662 between glass wafer 662 and a lens 664. Blue color filter 708 may be a photo-resist coating. The transmission spectrum of blue color filter 708 is depicted in FIG. 8C. A UV-IR-cut filter 710 is disposed on a glass wafer 622 underneath a lens 620. UV-IR-cut filter 710 may be multilayer dielectric coatings. For example, the multilayer dielectric coatings may include 30 alternate layers of high and low refractive indexes. The daylight spectrum transmitted through UV-IR-cut filter 710 is depicted in FIG. 8D. The transmission spectra of UV-IR-cut filter 710 for 0°, 25°, 30°, and 35° incident light are depicted in FIG. 8E. For example, UV-IR-cut filter cuts the transmissions of wavelengths longer than 650 nm and shorter than 420 nm.

Blue filter 708 may be formed on either side of glass wafer 662, or either side of a second glass wafer 666. Similarly, UV-IR-cut filter 710 may be formed on either side of glass wafer 622, or either side of a second glass wafer 630, in accordance with the teachings of the present invention.

It is apparent that only R lens cube 502 requires an IR-cut filter. G lens cube 504 and B lens cube 506 require no IR-cut filter. C lens cube 508 uses a combined UV-IR-cut filter and no individual IR-cut filter is required. Thus, a cost saving in IR-cut filter coating can be achieved in accordance with the teachings of the present invention.

Figure 9:
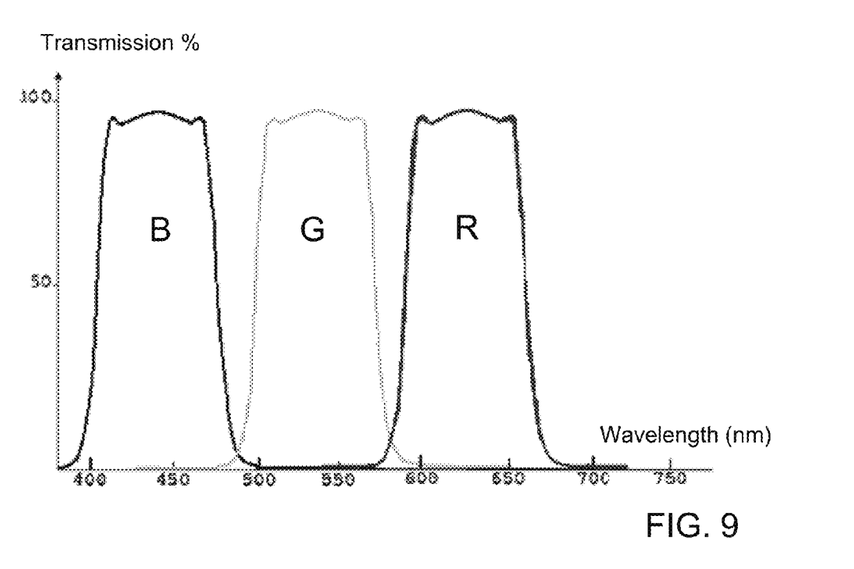
FIG. 9 illustrates example transmission spectra of multilayer dielectric coatings red, green, and blue bandpass filters in accordance with the teachings of the present invention.

In another example, photo-resist coating red filter 704, green filter 706, and blue filter 708 are replaced with multilayer dielectric coated red filter 724, green filter 726, and blue filter 728, respectively, as depicted in FIGS. 7A and 7B, in accordance with the teachings of the present invention. The multilayer dielectric coated filters are bandpass filters. The transmission spectra of multilayer dielectric coated red filter 724, green filter 726, and blue filter 728 are shown in FIG. 9. For example, a multilayer dielectric coated color filter may include alternate layers of high and low refractive indexes. Since red filter 724 is a bandpass filter, an IR-cut filter, e.g., IR-cut filter 702, is no longer necessary. Thus, there would be an additional cost savings of an IR-cut filter coating. The bandpass filters will also alleviate the crosstalk of photo-resist filters as shown in FIG. 4.

Figure 10:
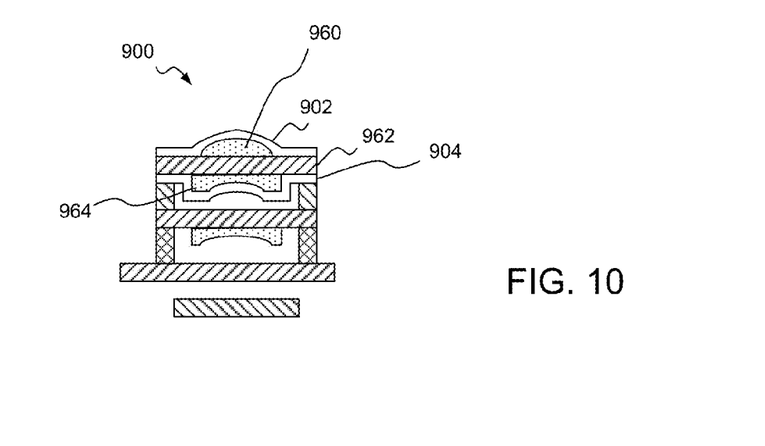
FIG. 10 illustrates the cross section of a lens array on a partitioned image sensor in accordance with the teachings of the present invention.

In yet another example, the IR-cut filter, the UV-IR-cut filter, and the red, green, and blue filters may appropriately be coated as a filter 902 over a lens 960 on a glass wafer 962 and over the surface of glass wafer 962 surrounding lens 960, or a filter 904 over a lens 964 on the other side of glass wafer 962 and over the surface on glass wafer 962 surrounding lens 964 as depicted in FIG. 10, in accordance with the teachings of the present invention. FIG. 10 shows a lens cube 900, which may be one of lens cubes depicted in FIGS. 7A and 7B.

Figure 11:
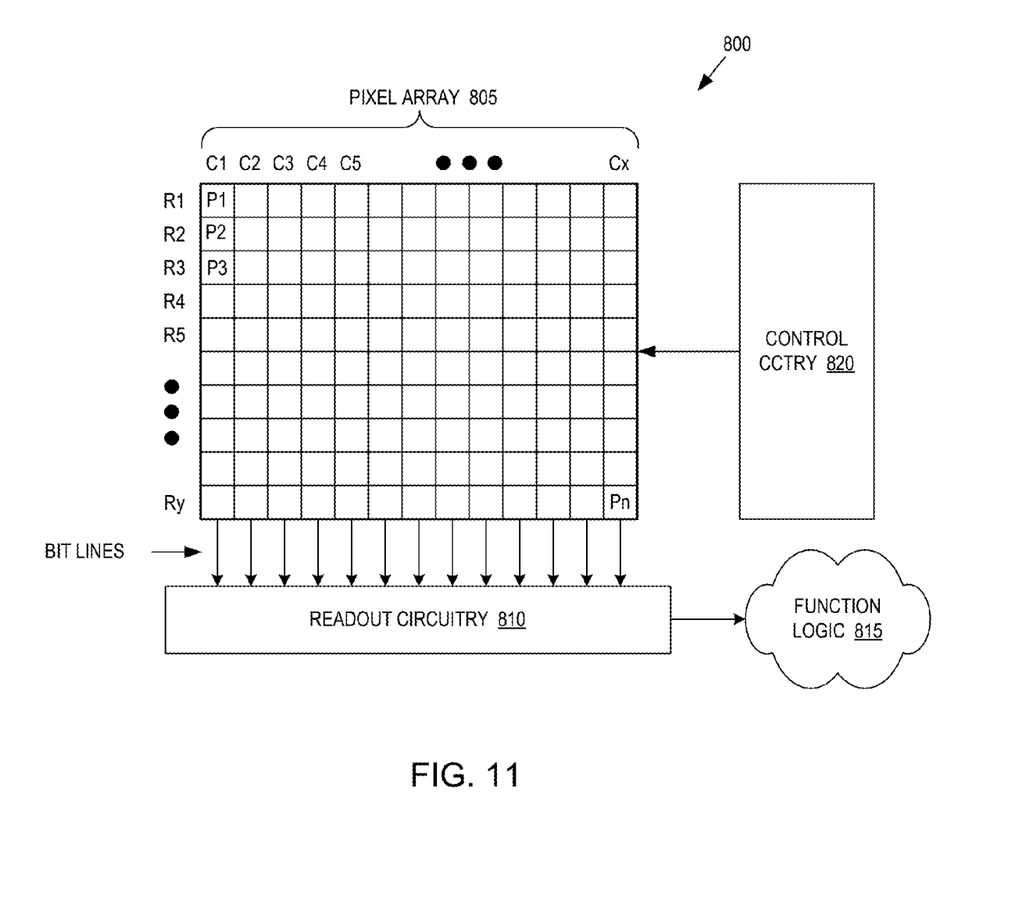
FIG. 11 is a block diagram illustrating one example of an image sensor in accordance with the teachings of the present invention.

FIG. 11 is a block diagram illustrating an image sensor 800, in accordance with the teachings of the present invention. Image sensor 800 is one example implementation of image sensor 220 of FIG. 2, or image sensor 501 of FIG. 6. The illustrated example of image sensor 800 includes a pixel array 805, readout circuitry 810, function logic 815, and control circuitry 820. Pixel array 805 may be partitioned into four partitioned areas such as shown in FIG. 2 (not shown in FIG. 11).

Pixel array 805 is a two-dimensional (2D) array of an image sensor or pixels (e.g., pixels P1, P2, . . . , Pn). Each pixel may be a CMOS pixel or a CCD pixel. As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, pixel array 805 is a backside illuminated (BSI) image sensor. In one example, pixel array 805 is a frontside illuminated (FSI) image example, pixel array 805 is partitioned into a plurality of partitioned areas. Each partitioned area is covered by a color filter.

After each pixel has acquired its image data or image charge, the image data is readout by readout circuitry 810 and transferred to function logic 815. Readout circuitry 810 may include amplification circuitry, analog-to-digital (ADC) conversion circuitry, or otherwise. Function logic 815 may simply store the image data or even manipulate the image data by applying post image effects (e.g., crop, rotate, remove red eye, adjust brightness, adjust contrast, or otherwise). In one example, readout circuitry 810 may readout a row of image data at a time along readout column lines (illustrated) or may readout the image data using a variety of other techniques (not illustrated), such as a serial readout or a full parallel readout of all pixels simultaneously.

Control circuitry 820 is coupled to pixel array 805 to control operational characteristic of pixel array 805. For example, control circuitry 820 may generate a shutter signal for controlling image acquisition. In one embodiment, the shutter signal is a global shutter signal for simultaneously enabling all pixels within pixel array 805 to simultaneously capture their respective image data during a single acquisition window. In an alternative embodiment, the shutter signal is a rolling shutter signal whereby each row, column, or group of pixels is sequentially enabled during consecutive acquisition windows.

It is appreciated that the low profile image capture unit is not limited to 2×2 lens array, any size of lens array is possible. Accordingly, the image sensor is not limited to four partitioned areas, any number of partitioned areas is possible. The partitioned area of image sensor may be square or rectangular. The cross section of lens cube may be circular, ellipse, square, or rectangular. The image sensor may be a CMOS image sensor or a CCD.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An apparatus, comprising:
   an image sensor including N image sensor regions arranged thereon; and
   N lens structures included in a lens array disposed proximate to the image sensor, each one of the N lens structures arranged to focus a single image onto a respective one of the N image sensor regions, the N lens structures including a first lens structure having a red color filter, a second lens structure having a green color filter, and a third lens structure having a blue color filter, each one of the N lens structures including a glass wafer and a lens formed on the glass wafer, wherein each one of the red color filter, the green color filter, and the blue color filter is one of coated on the glass wafer underneath the lens and coated over the lens on the glass wafer, wherein the first lens structure further includes an IR-cut filter including multilayer dielectric coatings, wherein the IR-cut filter is one of coated on the glass wafer underneath the lens and coated over the lens on the glass wafer.

2. The apparatus of claim 1 wherein the N lens structures further include a fourth lens structure having a UV-IR-cut filter including multilayer dielectric coatings, wherein the UV-IR-cut filter is one of coated on the glass wafer underneath the lens and coated over the lens on the glass wafer.

3. The apparatus of claim 1 wherein the red color filter, the green color filter, and the blue color filter comprise photo-resist coatings.

4. The apparatus of claim 1 wherein the red color filter, the green color filter, and the blue color filter comprise multilayer dielectric coatings.

5. The apparatus of claim 1 wherein the N lens structures include the first lens structure having a first focal length and positioned the first focal length away from the respective one of the N image sensor regions, the second lens structure having a second focal length and positioned the second focal length away from the respective one of the N image sensor regions, and the third lens structure having a third focal length and positioned the third focal length away from the respective one of the N image sensor regions, wherein the first focal length, the second focal length and the third focal length are different, wherein the first focal length corresponds with light having a red color, wherein the second focal length corresponds with light having a green color and wherein the third focal length corresponds with light having a blue color.

6. The apparatus of claim 5 wherein the N lens structures further include a fourth lens structure having a fourth focal length and positioned the fourth focal length away from the respective one of the N image sensor regions, wherein the fourth focal length is the same with one of the first focal length, the second length and the third focal length.

7. The apparatus of claim 1 wherein the N lens structures include the first lens structure having a first radius of curvature and positioned a focal length away from the respective one of the N image sensor regions, the second lens structure having a second radius of curvature and positioned the focal length away from the respective one of the N image sensor regions, and the third lens structure having a third radius of curvature and positioned the focal length away from the respective one of the N image sensor regions, wherein the first radius of curvature, the second radius of curvature and the third radius of curvature are different, wherein the first radius of curvature corresponds with light having a red color, wherein the second radius of curvature corresponds with light having a green color and wherein the third radius of curvature corresponds with light having a blue color.

8. The apparatus of claim 7 wherein the N lens structures further include a fourth lens structure having a fourth radius of curvature and positioned the focal length away from the respective one of the N image sensor regions, wherein the fourth radius of curvature is the same with one of the first radius of curvature, the second radius of curvature and the third radius of curvature.

9. An imaging system, comprising:
a pixel array including an image sensor having N image sensor regions arranged therein, wherein each one of the N image sensor regions has a plurality of pixels arranged therein;
N lens structures included in a lens array disposed proximate to the image sensor, each one of the N lens structures is arranged to focus a single image onto a respective one of the N image sensor regions, the N lens structures include a first lens structure having a red color filter, a second lens structure having a green color filter, and a third lens structure having a blue color filter, each one of the N lens structures including a glass wafer and a lens formed on the glass wafer, wherein each one of the red color filter, the green color filter, and the blue color filter is one of coated on the glass wafer underneath the lens and coated over the lens on the glass wafer, wherein the first lens structure further includes an IR-cut filter including multilayer dielectric coatings, wherein the IR-cut filter is one of coated on the glass wafer underneath the lens and coated over the lens on the glass wafer;
control circuitry coupled to the pixel array to control operation of the pixel array; and
readout circuitry coupled to the pixel array to readout image data from the plurality of pixels.

10. The imaging system of claim 9 further comprising function logic coupled to the readout circuitry to store the single image data readout from each one of the N image sensor regions.

11. The imaging system of claim 9 wherein the N lens structures further include a fourth lens structure having a UV-IR-cut filter including multilayer dielectric coatings, wherein the UV-IR-cut filter is one of coated on the glass wafer underneath the lens and coated over the lens on the glass wafer.

12. The imaging system of claim 9 wherein the red color filter, the green color filter, and the blue color filter comprise photo-resist coatings.

13. The imaging system of claim 9 wherein the red color filter, the green color filter, and the blue color filter comprise multilayer dielectric coatings.

14. The imaging system of claim 9 wherein the N lens structures include the first lens structure having a first focal length and positioned the first focal length away from the respective one of the N image sensor regions, the second lens structure having a second focal length and positioned the second focal length away from the respective one of the N image sensor regions, and the third lens structure having a third focal length and positioned the third focal length away from the respective one of the N image sensor regions, wherein the first focal length, the second focal length and the third focal length are different, wherein the first focal length corresponds with light having a red color, wherein the second focal length corresponds with light having a green color and wherein the third focal length corresponds with light having a blue color.

15. The imaging system of claim 14 wherein the N lens structures further include a fourth lens structure having a fourth focal length and positioned the fourth focal length away from the respective one of the N image sensor regions, wherein the fourth focal length is the same with one of the first focal length, the second length and the third focal length.

16. The imaging system of claim 9 wherein the N lens structures include the first lens structure having a first radius of curvature and positioned a focal length away from the respective one of the N image sensor regions, the second lens structure having a second radius of curvature and positioned the focal length away from the respective one of the N image sensor regions, and the third lens structure having a third radius of curvature and positioned the focal length away from the respective one of the N image sensor regions, wherein the first, second and third radii of curvature are different, wherein the first radius of curvature corresponds with light having a red color, wherein the second radius of curvature corresponds with light having a green color and wherein the third radius of curvature corresponds with light having a blue color.

17. The imaging system of claim 16 wherein the N lens structures further include a fourth lens structure having a fourth radius of curvature and positioned the focal length away from the respective one of the N image sensor regions, wherein the fourth radius of curvature is the same with one of the first radius of curvature, the second radius of curvature and the third radius of curvature.

* * * * *